(12) United States Patent
Tanaka et al.

(10) Patent No.: US 8,614,403 B2
(45) Date of Patent: Dec. 24, 2013

(54) ELECTROSTATIC CAPACITANCE TYPE INPUT DEVICE

(75) Inventors: Hiroshi Tanaka, Tokyo (JP); Takashi Ueno, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 105 days.

(21) Appl. No.: 13/322,052

(22) PCT Filed: May 26, 2010

(86) PCT No.: PCT/JP2010/003540
§ 371 (c)(1),
(2), (4) Date: Jan. 18, 2012

(87) PCT Pub. No.: WO2010/137316
PCT Pub. Date: Dec. 2, 2010

(65) Prior Publication Data
US 2012/0132511 A1    May 31, 2012

(30) Foreign Application Priority Data
May 28, 2009   (JP) .................................. 2009-129326

(51) Int. Cl.
*H03K 17/975*   (2006.01)

(52) U.S. Cl.
USPC .......................................................... 200/600

(58) Field of Classification Search
USPC .......... 200/600, 46, 5 R, 292, 511–512, 11 D, 200/11 DA, 5 A
See application file for complete search history.

(56) References Cited

U.S. PATENT DOCUMENTS 7,864,503 B2 *   1/2011  Chang ........................... 361/288
8,040,321 B2 *  10/2011  Peng et al. .................... 345/169

(Continued)

FOREIGN PATENT DOCUMENTS

JP    3144241    7/2008
JP    3144563    8/2008

(Continued)

OTHER PUBLICATIONS

English Translation of the Written Opinion of the International Searching Authority dated Jul. 20, 2010 issued in corresponding International Patent Application No. PCT/JP2010/003540.

(Continued)

*Primary Examiner* — Edwin A. Leon
*Assistant Examiner* — Anthony R. Jimenez

(57) ABSTRACT

An electrostatic capacitance type input device is provided which has a structure in which translucent electrodes are aligned on the same layer in two axial directions, and has features that jumpers for connecting among the translucent electrodes in one of the two axial directions can be prevented from becoming conspicuous, and disconnection is less likely to occur. Jumpers 8 formed of an electrically conductive material are formed on a surface of a substrate 2, and thereafter an insulating film 6 is provided so as to cover the jumpers 8 and the substrate 2, and first translucent electrodes 3 and second translucent electrodes 4 are provided on the insulating film 6 so as to form a matrix. The first translucent electrodes 3 aligned in the leftward/rightward direction in the drawings are electrically connected to each other by the jumpers 8 via through holes 7 formed in the insulating film 6. On the other hand, the second translucent electrodes 4 aligned in the direction orthogonal to the surface of a sheet are connected to each other by connecting portions 5 which are formed by patterning so as to be integrated with the second translucent electrodes 4. Since the jumpers 8 for connecting among the first translucent electrodes 3 are formed on the substrate 2, the jumper 8 can be prevented from becoming conspicuous as viewed from the surface side.

21 Claims, 11 Drawing Sheets

(56) References Cited

U.S. PATENT DOCUMENTS

2009/0236151 A1    9/2009   Yeh et al.
2009/0262096 A1    10/2009  Teramoto

FOREIGN PATENT DOCUMENTS

| | | |
|---|---|---|
| JP | 3149113 | 2/2009 |
| JP | 2009-230735 | 10/2009 |
| JP | 2009-265748 | 11/2009 |

OTHER PUBLICATIONS

International Search Report for PCT/JP2010/003540 mailed Jul. 20, 2010.

* cited by examiner

F I G. 4
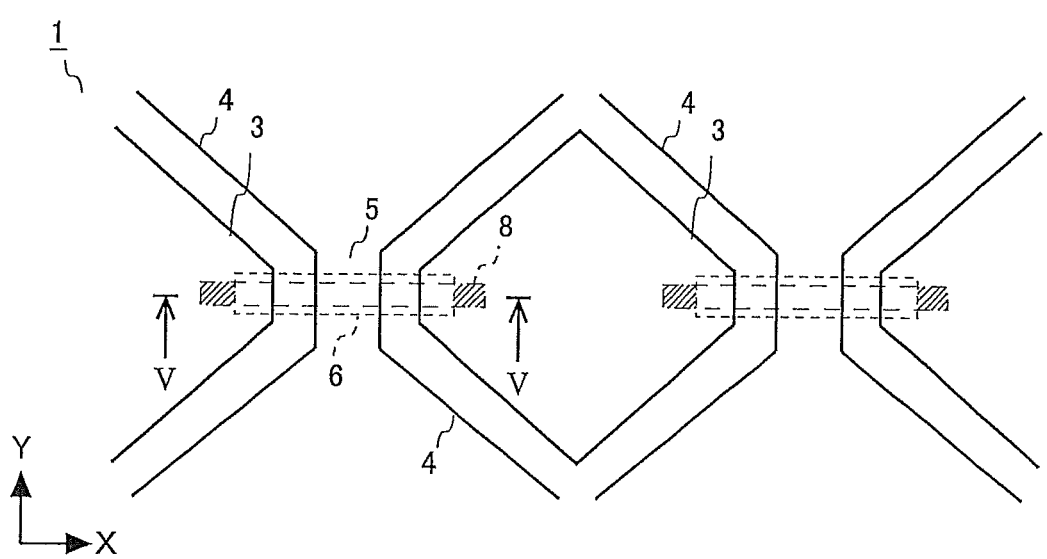

ELECTROSTATIC CAPACITANCE TYPE INPUT DEVICE

CROSS REFERENCE TO RELATED APPLICATIONS

This application claims the benefit under 35 U.S.C. Section 371, of PCT International Application No. PCT/JP2010/003540, filed May 26, 2010, which claimed priority to Japanese Application No. 2009-129326, filed May 28, 2009 in the Japanese Patent Office, the disclosures of which are hereby incorporated by reference.

TECHNICAL FIELD

The present invention relates to electrostatic capacitance type input devices each of which has a plurality of translucent electrodes aligned on the same layer, and is capable of detecting a position of an electrode touched by a finger or the like.

BACKGROUND ART

In recent years, touch panels are used for operation sections of various electronic devices including mobile telephones, portable information terminals, and car navigation systems. The touch panel is formed by an input device capable of detecting a position touched by a finger or the like being bonded onto a display screen for use in a display device such as a liquid crystal panel. Input devices of the touch panels are classified into various types of input devices such as resistive film type input devices and electrostatic capacitance type input devices, depending on a structure and a detection mode. Among them, the electrostatic capacitance type input devices each have translucent conductive films (translucent electrodes) formed on one substrate, and identify a touched position by detecting change of an amount of low power electric current flowing through electrostatic capacitance (which is generated by touching of a finger or the like), and the electrostatic capacitance type input devices are advantageous in that transmittancy can be enhanced, as compared to the resistive film type input devices.

FIG. 6 is a plan view schematically illustrating a structure of a conventional electrostatic capacitance type input device described in Patent Literature 1, and FIG. 7 is an enlarged cross-sectional view taken along a line VII-VII shown in FIG. 6.

An electrostatic capacitance type input device 91 includes, on a substrate 92, a plurality of X-axis traces 93 which extend in the X-axis direction (upward/downward direction in the drawings), and a plurality of Y-axis traces 94 which extend in the Y-axis direction (the leftward/rightward direction in the drawings), and which intersect the X-axis traces 93. The electrostatic capacitance type input device 91 detects positions touched by a finger or the like in the X-axis direction and the Y-axis direction.

The X-axis traces 93 are each formed by a plurality of transparent electrodes 95 aligned in the X-axis direction being connected to each other. On the other hand, the Y-axis traces 94 are each formed by a plurality of transparent electrodes 96 positioned intermittently in the Y-axis direction being electrically connected to each other through jumpers 99 formed of an electrically conductive material. The jumpers 99 are formed on an insulating film 97 which is layered over the X-axis traces 93 and the Y-axis traces 94, so as to extend above and across portions (portions each connecting between a pair of transparent electrodes 95 adjacent to each other) of the X-axis traces. The jumpers 99 are connected to the transparent electrodes 96 via through holes 98 located on the transparent electrodes 96.

Thus, in the structure described in Patent Literature 1, an insulating film is formed over the entire surface of the substrate 92 so as to insulate the X-axis traces 93 from the jumpers 99 extending above and across the X-axis traces, and the through holes 98 are formed in only portions in which the jumpers 99 are connected to the transparent electrodes 96.

Further, according to Patent Literature 2, a structure is described in which insulating films are formed in only positions across which jumpers extend, instead of an insulating film being formed over the entire surface of a substrate.

CITATION LIST

Patent Literature

Patent Literature 1: Japanese Registered Utility Model No. 3144563
Patent Literature 2: Japanese Registered Utility Model No. 3144241

SUMMARY OF THE INVENTION

Problems to be Solved by the Invention

The conventional electrostatic capacitance type input devices as described above are each formed by the translucent electrodes, the insulating film, and the jumpers (electric conductor) being layered in order, respectively, on the substrate. In this case, the following problems may arise.

Firstly, since the jumpers are formed on a side closer to persons (on a side opposite to a liquid crystal panel side), in a case where the jumpers are formed of an electrically conductive material having metallic luster, jumpers may become conspicuous.

Secondly, when the insulating film has a portion formed in an overhanging state, the jumper is likely to extend across the overhanging portion, which is likely to lead to disconnection of the jumper.

FIG. 8 is a plan view illustrating a case in which overhanging of the insulating film occurs in the electrostatic capacitance type input device shown in FIG. 6, and FIG. 9 is a cross-sectional view taken along a line IX-IX shown in FIG. 8.

The insulating film 97 is formed so as to be layered over the entirety of the substrate 92, and thereafter etching is selectively performed on portions of the insulating film, thereby forming the through holes 98. However, when a time for the etching process is too long, the etching progresses in a deep portion below the surface of the insulating film 97, and a portion of the insulating film 97 on the surface side may project (overhang) toward the center side of the through hole 98 in some cases, as shown in the cross-sectional view of FIG. 9.

For example, when the overhanging occurs in a range indicated by an arrow in FIG. 8, the jumper 99 for connecting between a pair of transparent electrodes 96 adjacent to each other is disconnected as schematically indicated by the alternate long and two short dashes line in FIG. 9, so that conductivity in the Y-axis trace 94 cannot be obtained. If it is assumed that the overhanging occurs in half the circumference of the through hole, a region in which the jumpers 99 are formed overlap the overhanging region with about 50 percent probability, and it indicates that the disconnection may occur with a substantially high probability.

FIG. 10 is a plan view illustrating a case in which overhanging of the insulating film occurs in the conventional electrostatic capacitance type input device described in Patent Literature 2, and FIG. 11 is a cross-sectional view taken along a line XI-XI shown in FIG. 10.

Similar problems are likely to arise also in the structure, as described in Patent Literature 2, in which the insulating films 97 are formed in only portions in which the jumpers 99 extend across the X-axis traces 93. For example, when the overhanging occurs in a range (a short side portion of the insulating film 97) indicated by an arrow in FIG. 10, the jumper 99 is disconnected as schematically indicated by the alternate long and two short dashes line in FIG. 11, so that conductivity in the Y-axis trace 94 cannot be obtained.

Therefore, an object of the present invention is to make available an electrostatic capacitance type input device that has a structure in which translucent electrodes are aligned on the same layer in two axial directions, and that has features that jumpers for connecting among the translucent electrodes in one of the two axial directions are prevented from becoming conspicuous, and disconnection is less likely to occur.

Solution to the Problems

An electrostatic capacitance type input device according to the present invention includes: a substrate; a plurality of electric conductors aligned on the substrate in a first direction and a second direction orthogonal to the first direction; an insulating film formed so as to cover the substrate and the plurality of electric conductors; a plurality of first translucent electrodes aligned on the insulating film in the first direction and the second direction; and a plurality of second translucent electrodes aligned on the insulating film in the first direction and the second direction such that each second translucent electrode is positioned between corresponding lines of the first translucent electrodes and between corresponding rows of the first translucent electrodes. The plurality of first translucent electrodes aligned in the first direction are electrically connected to each other by the plurality of electric conductors via through holes formed in the insulating film, and the plurality of second translucent electrodes aligned in the second direction are connected to each other on the insulating film.

Further, an electrostatic capacitance type input device according to the present invention includes: a substrate; a plurality of electric conductors aligned on the substrate in a first direction and a second direction orthogonal to the first direction; a plurality of insulating films formed so as to partially cover the plurality of electric conductors, respectively; a plurality of first translucent electrodes aligned in the first direction and the second direction; and a plurality of second translucent electrodes aligned in the first direction and the second direction such that each second translucent electrode is positioned between corresponding lines of the first translucent electrodes and between corresponding rows of the first translucent electrodes. The plurality of first translucent electrodes aligned in the first direction contact with portions which are included in the plurality of electric conductors, and which are not covered by the plurality of insulating films, to be electrically connected to each other by the plurality of electric conductors. The plurality of second translucent electrodes aligned in the second direction are connected to each other on the plurality of insulating films.

Advantageous Effects of the Invention

According to the present invention, in an electrostatic capacitance type input device having a plurality of translucent electrodes aligned on the same layer, since electric conductors used for connecting among the translucent electrodes are formed on a substrate (that is, inside the input device), the electric conductors can be prevented from becoming conspicuous. Further, the first translucent electrodes are formed so as to cover the entirety of portions which are included in the electric conductors, and which are not covered by an insulating layer, so that disconnection of the electric conductors can be prevented regardless of a cross-sectional shape of an insulating film.

Further, in a case where the entirety of openings of through holes is covered by the translucent electrodes, even if overhanging of the insulating film occurs in a portion of a range of the openings, the translucent electrodes can reach the surfaces of the electric conductors along inner walls of the through holes on which no overhanging occurs. Therefore, disconnection of the electric conductors can be prevented regardless of a cross-sectional shape of the inner walls of the through holes.

Furthermore, since the translucent electrodes can have a surface contact with portions which are included in the electric conductors, and which are not covered by the insulating film, even when overhanging occurs in outer circumferential walls of the insulating film in an etching process, connection between the translucent electrodes and the electric conductors can be ensured.

BRIEF DESCRIPTION OF THE DRAWINGS

FIG. 4 is a plan view schematically illustrating a structure of an electrostatic capacitance type input device according to a second embodiment of the present invention.

DESCRIPTION OF EMBODIMENTS

First Embodiment

Figure 1:
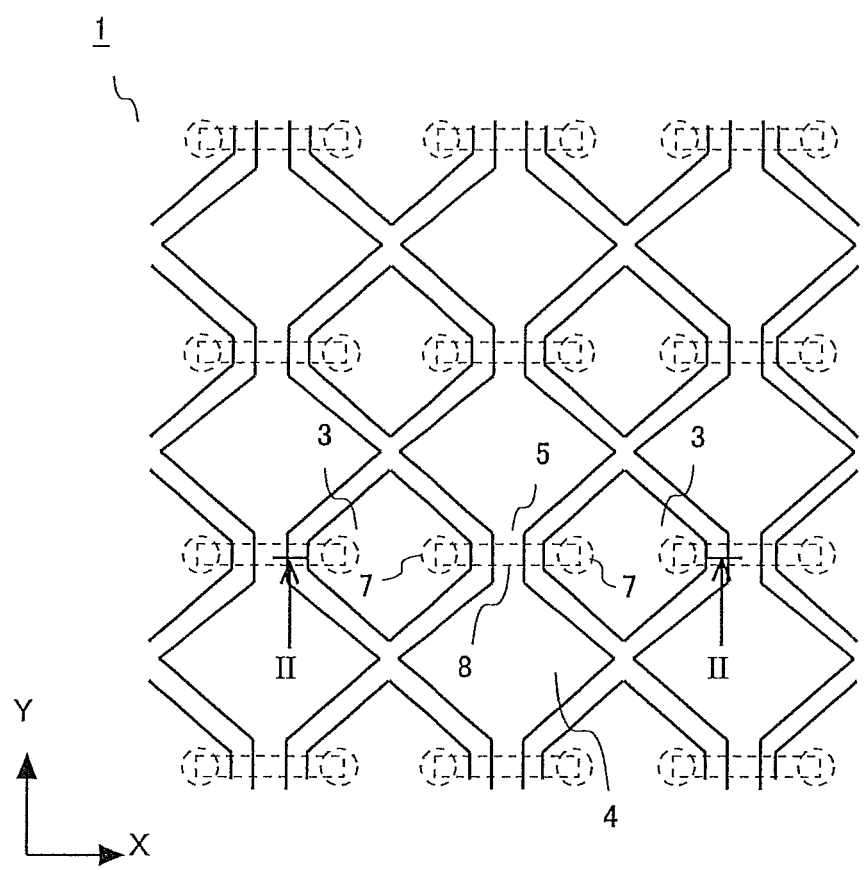
FIG. 1 is a plan view schematically illustrating a structure of an electrostatic capacitance type input device according to a first embodiment of the present invention.
Figure 2:
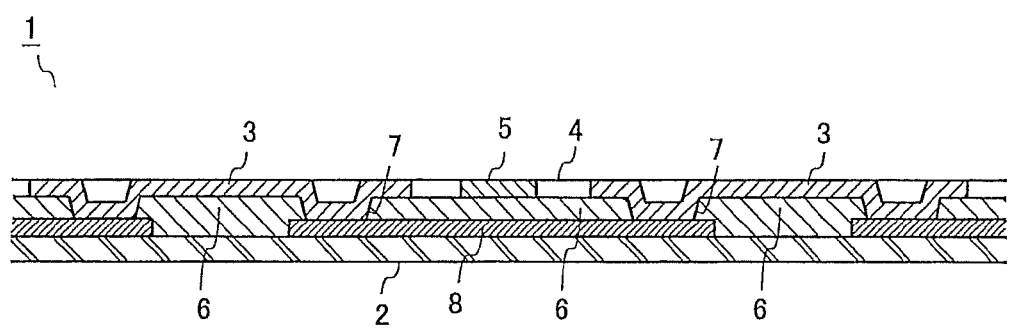
FIG. 2 is an enlarged cross-sectional view taken along a line II-II shown in FIG. 1.
Figure 3:
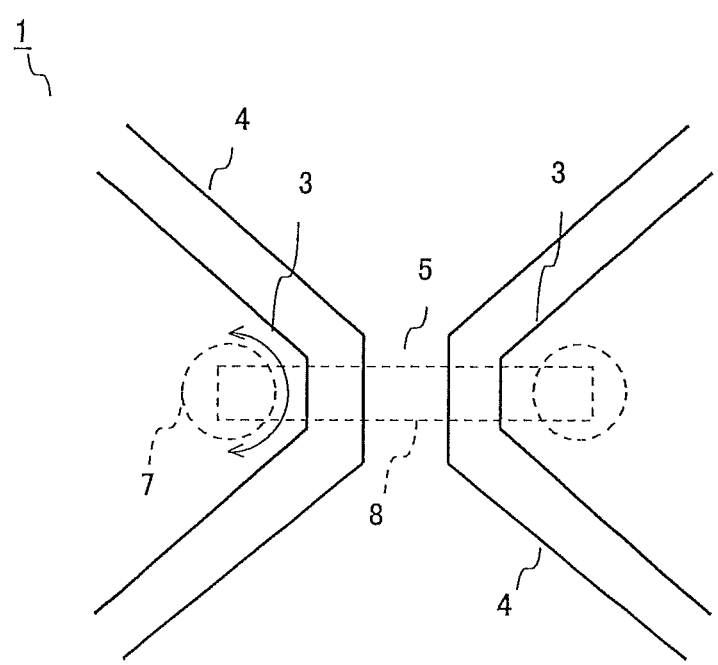
FIG. 3 is an enlarged view of a vicinity of a through hole shown in FIG. 1.

FIG. 1 is a plan view schematically illustrating a structure of an electrostatic capacitance type input device according to a first embodiment of the present invention, and FIG. 2 is an enlarged cross-sectional view taken along a line II-II shown in FIG. 1. Further, FIG. 3 is an enlarged view of a vicinity of a through hole shown in FIG. 1.

An electrostatic capacitance type input device 1 includes: a substrate 2; a plurality of jumpers 8; an insulating film 6; a plurality of first translucent electrodes 3; and a plurality of second translucent electrodes 4. The jumpers 8, the insulating film 6, and the translucent electrodes (the first translucent electrodes 3 and the second translucent electrodes 4) are formed on the substrate 2 in order, respectively.

The jumpers 8 are formed of an electrically conductive material, and are aligned so as to form a matrix on the surface of the substrate 2. The jumpers 8 are formed for connecting among the first translucent electrodes 3 in the X-axis direction, and are each formed at such a position and in such a size that both end portions thereof overlap each of a pair of the first translucent electrodes 3 which are adjacent to each other in the X-axis direction. The jumpers 6 may be formed of, for example, an ITO (Indium Tin Oxide), an Mo/Al/Mo layered component, Ag, an Ag alloy, and/or an electrically conductive high-molecular material.

The insulating film 6 is formed by an insulting material being layered so as to cover the entirety of the surfaces of the jumpers 8 and the substrate 2. Through holes 7 are formed, in portions in which the first translucent electrodes 3 and the jumpers 8 overlap each other, so as to reach the surfaces of the jumpers 8.

The first translucent electrodes 3 and the second translucent electrodes 4 are aligned on the same layer in the X-axis direction and the Y-axis direction, respectively, orthogonal to the X-axis direction, so as to form a matrix. The first translucent electrodes 3 and the second translucent electrodes 4 are formed in the same process step by using an electrically-conductive translucent material such as an ITO.

Although the first translucent electrodes 3 are not connected to each other on the insulating film 6 in the X-axis direction and the Y-axis direction as shown in FIG. 1, the first translucent electrodes 3 are connected via the through holes 7 to the jumpers 8 formed on the substrate 2. As a result, the first translucent electrodes 3 aligned in the X-axis direction are electrically connected to each other.

On the other hand, the second translucent electrodes 4 are positioned one by one between lines formed by the first translucent electrodes 3 and between rows formed by the first translucent electrodes 3, and the second translucent electrodes 4 are connected to each other on the insulating film 6 in the Y-axis direction through connecting portions 5 that are formed by patterning simultaneously with the second translucent electrodes 4.

When the first translucent electrodes 3 connected to each other in the X-axis direction and the second translucent electrodes 4 connected to each other in the Y-axis direction are aligned on the same layer, intersecting portions are formed, so that a wiring section such as the jumpers 8 need to be provided for connection in one of the directions. In the electrostatic capacitance type input device 1 according to the present embodiment, the jumpers 8 are formed on the surface of the substrate 2, and the insulating film 6, the first and the second translucent electrodes 3 and 4 are formed thereon, so that the jumpers 8 can be prevented from becoming conspicuous as viewed from the surface side.

Figure 9:
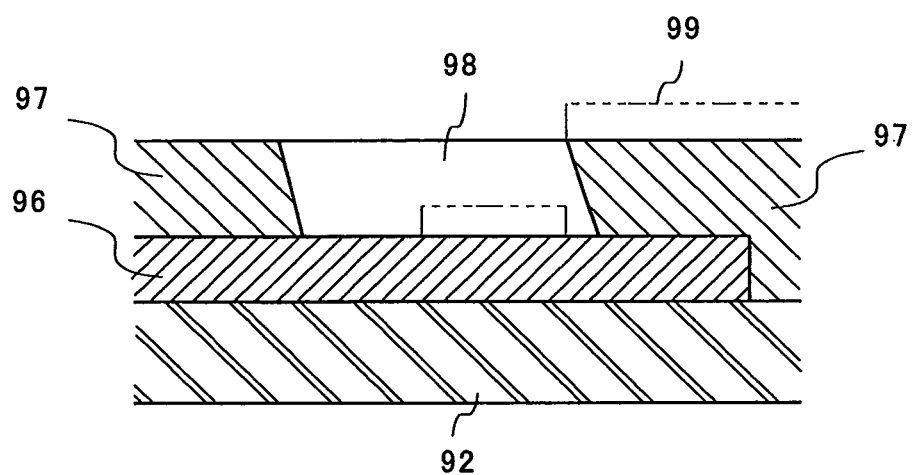
FIG. 9 is a cross-sectional view taken along a line IX-IX shown in FIG. 8.
Figure 10:
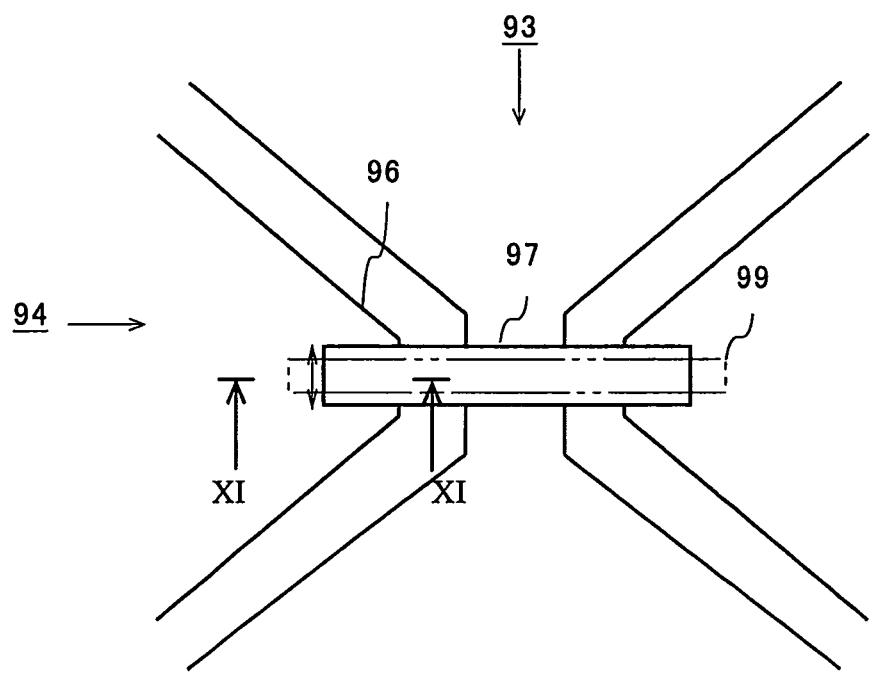
FIG. 10 is a plan view illustrating a case in which overhanging of an insulating film occurs in a conventional electrostatic capacitance type input device.
Figure 11:
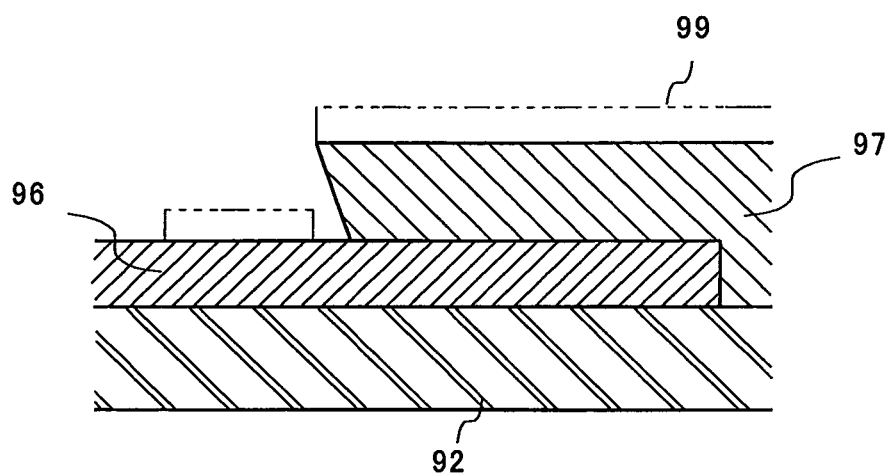
FIG. 11 is a cross-sectional view taken along a line XI-XI shown in FIG. 10.

In the present embodiment, since the entirety of an opening of each through hole 7 is covered by a corresponding one of the first translucent electrodes 3, even in a case where, for example, overhanging (see FIG. 9) of the insulating film occurs in a range indicated by an arrow in FIG. 3, each first translucent electrode 3 can reach the surface of the jumper 8 along an inner wall of the through hole 7 on which the overhanging does not occur. Therefore, disconnection of the jumpers 8 can be prevented regardless of a cross-sectional shape of the inner wall of each through hole 7.

As described above, the jumpers 8 may be formed by using various electrically conductive materials, and when a material having a light-blocking effect is used, there is the following additional advantages.

When the jumpers 8 are formed of a light-blocking material, alignment marks used for positioning can be formed on the substrate 2 by using the same material as used for the jumpers 8 simultaneously in a process step of patterning for the jumpers 8. As a result, an alignment mark forming process step can be reduced, and positioning for exposure to light can be performed by using a standard reading mechanism without performing an extra modification for an exposure device that is used for forming films of the second and subsequent layers.

Further, when alignment in position is performed through visual confirmation using a microscope and/or the like in order to form films of the second and subsequent layers, visibility is enhanced due to the jumpers 8 in the first layer being formed of a light-blocking material, thereby enabling the alignment in position to be facilitated.

Further, an electrically conductive high-molecular material can be used as the light-blocking material. In general, there is a tradeoff between translucency and electric conductivity in a high-molecular film. However, even if light-blocking effect is found in a limited range in which the jumpers 8 are formed, influence on light transmitting property is small in the entirety of the input device. Further, from the viewpoint of electric conductivity, a material having a resistance value approximately equivalent to that of an ITO may be used, and an electrically conductive high-molecular material which enables enhancement of productivity can be used.

When a metal is used as the light-blocking material, patterning can be performed for the jumpers 8 and a metal wiring layer (wiring connected to the translucent electrodes, and the like) formed on the substrate 2, which is not shown, simultaneously in one process step. Therefore, the number of process steps can be reduced, thereby enabling cost reduction.

Second Embodiment

Figure 5:
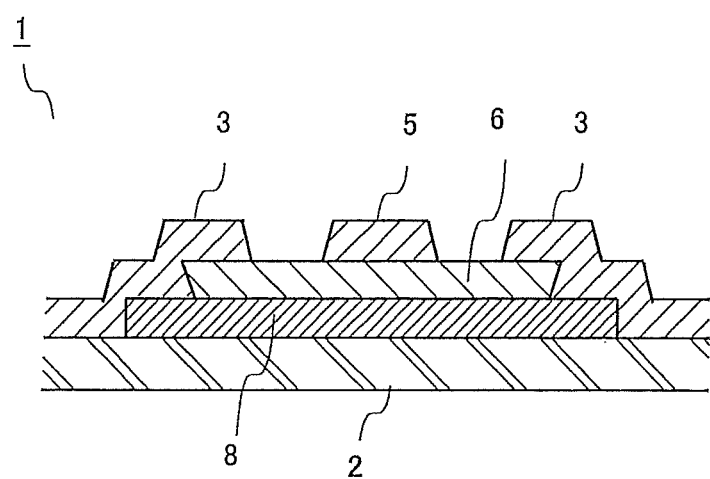
FIG. 5 is an enlarged cross-sectional view taken along a line V-V shown in FIG. 4.
Figure 6:
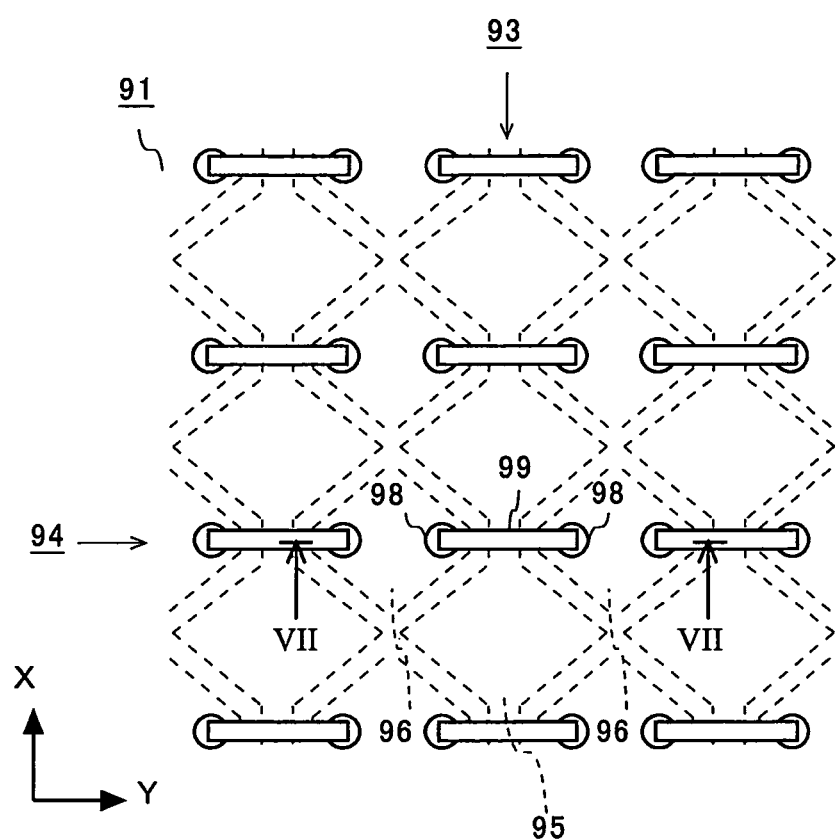
FIG. 6 is a plan view schematically illustrating a structure of a conventional electrostatic capacitance type input device.
Figure 7:
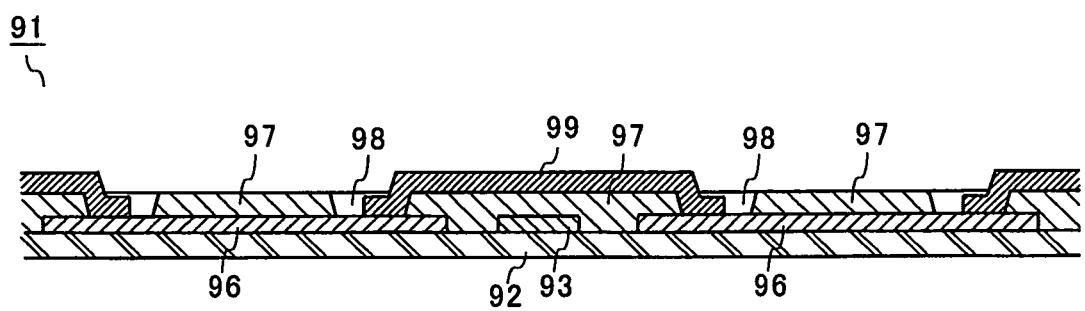
FIG. 7 is an enlarged cross-sectional view taken along a line VII-VII shown in FIG. 6.
Figure 8:
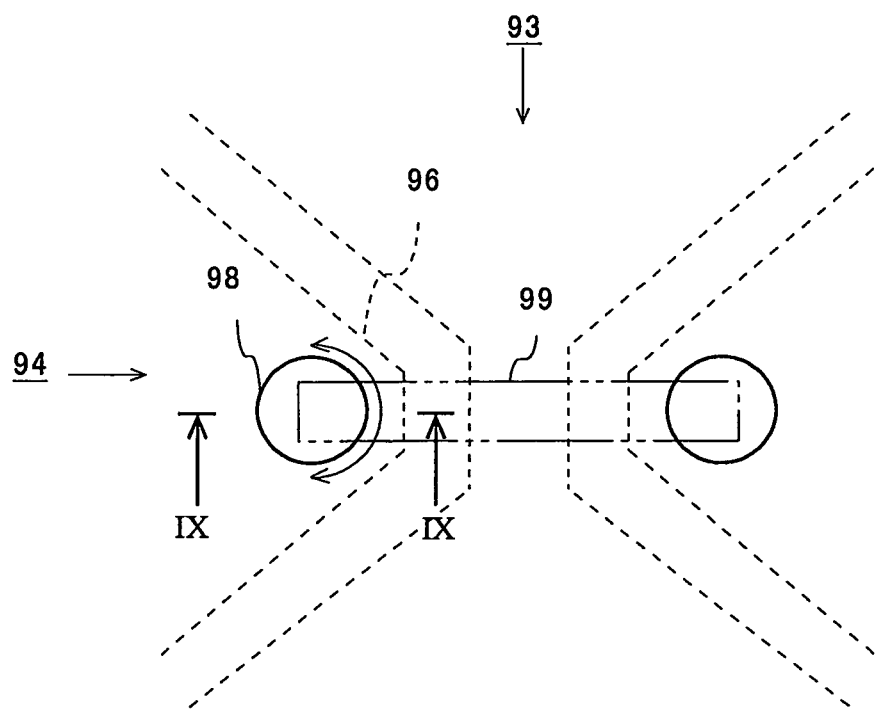
FIG. 8 is a plan view illustrating a case in which overhanging of an insulating film occurs in the electrostatic capacitance type input device shown in FIG. 6.

FIG. 4 is a plan view schematically illustrating a structure of an electrostatic capacitance type input device according to a second embodiment of the present invention, and FIG. 5 is an enlarged cross-sectional view taken along a line V-V shown in FIG. 4.

An electrostatic capacitance type input device according to the present embodiment has a structure in which the jumpers 8, the insulating films 6, the translucent electrodes (the first translucent electrodes 3 and the second translucent electrodes 4) are layered on the substrate 2 in order, respectively, as in the first embodiment. However, a region in which the insulating films 6 are formed is different from that described in the first embodiment. Hereinafter, a difference between the present embodiment and the first embodiment will be mainly described.

In the present embodiment, the insulating films 6 are provided in only portions which intersect the connecting portions 5 each connecting between the second translucent electrodes 4 adjacent to each other. More specifically, each insulating film 6 is formed so as to cover a corresponding one of the jumpers 8 except for a portion (diagonal lines portion) of regions in which the jumper 8 overlaps each of the first translucent electrodes 3 adjacent to each other. In the present embodiment, each jumper 8 has a portion which is not covered by a corresponding one of the insulating films 6, on both end portions. However, a region which is not covered by the insulating film 6 is not necessarily the end portions, and may be any portion of the region in which the jumper 8 overlaps the translucent electrodes.

Further, each of the first translucent electrodes 3 is formed so as to cover the entirety of a portion (the diagonal lines portion), on the surface of the jumper 8, which is not covered by the insulating film 6, and contacts with the portion of the jumper 8. Thus, a state in which the first translucent electrodes 3 aligned in the X-axis direction are electrically connected to each other can be obtained. On the other hand, the second translucent electrodes aligned in the Y-axis direction are connected to each other through the connecting portions 5 on the insulating films 6 covering the jumpers 8.

Also in the electrostatic capacitance type input device 1 according to the present embodiment, the jumpers 8 are formed on the surface of the substrate 2, and the insulating films 6, and the first and the second translucent electrodes 3 and 4 are formed thereon, so that the jumpers 8 can be prevented from becoming conspicuous as viewed from the surface side.

Further, in the electrostatic capacitance type input device 1 according to the present embodiment, since portions of the jumpers 8 which are not covered by the insulating films 6 can have a surface contact with the first translucent electrodes 3, even when the overhanging (a state in which a portion of the insulating film 6 on the surface side, among the cross-section of the outer circumferential wall of the insulating film 6, projects outward) occurs in an etching process, as indicated in a cross-section in FIG. 5, the connection between the first translucent electrodes 3 and the jumpers 8 can be ensured.

In each of the embodiments described above, an exemplary case is described in which the translucent electrodes in the X-axis direction are connected to each other through the jumpers. However, in the example shown in FIG. 1, a structure for the X-axis and a structure for the Y-axis may be replaced with each other, that is, the translucent electrodes in the X-axis direction may be connected to each other by the connecting portions, and the translucent electrodes in the Y-axis direction may be connected to each other through the jumpers.

INDUSTRIAL APPLICABILITY

The present invention can be used for forming, for example, touch panels used as input/output devices for use in various electronic devices.

DESCRIPTION OF THE REFERENCE CHARACTERS 1 electrostatic capacitance type input device
2 substrate
3 first translucent electrode
4 second translucent electrode
6 insulating film
7 through hole
8 jumper

The invention claimed is:

1. An electrostatic capacitance type input device comprising:
a substrate;
a plurality of electric conductors aligned on the substrate in a first direction and a second direction orthogonal to the first direction;
an insulating film formed so as to cover the substrate and the plurality of electric conductors with the plurality of electric conductors interposed between the substrate and the insulating film;
a plurality of first translucent electrodes aligned on the insulating film in the first direction and the second direction; and
a plurality of second translucent electrodes aligned on the insulating film in the first direction and the second direction such that each of the plurality of second translucent electrodes is positioned between corresponding lines of each of the plurality of first translucent electrodes and between corresponding rows of each of the plurality of first translucent electrodes, wherein
the plurality of first translucent electrodes aligned in the first direction are electrically connected to each other by the plurality of electric conductors via through holes formed in the insulating film, and
the plurality of second translucent electrodes aligned in the second direction are connected to each other on the insulating film.

2. An electrostatic capacitance type input device comprising:
a substrate;
a plurality of electric conductors aligned on the substrate in a first direction and a second direction orthogonal to the first direction;
a plurality of insulating films formed so as to partially cover the plurality of electric conductors, respectively, with the plurality of electric conductors interposed between the substrate and the plurality of insulating films, respectively;
a plurality of first translucent electrodes aligned in the first direction and the second direction; and
a plurality of second translucent electrodes aligned in the first direction and the second direction such that each of the plurality of second translucent electrodes is positioned between corresponding lines of each of the plurality of first translucent electrodes and between corresponding rows of each of the plurality of first translucent electrodes, wherein
the plurality of electric conductors and the plurality of insulating films are formed on the substrate in this order and then the plurality of first translucent electrodes and the plurality of second translucent electrodes are further formed on the substrate,
the plurality of electric conductors are formed on a surface of the substrate,
the plurality of first translucent electrodes aligned in the first direction contact with portions which are included in the plurality of electric conductors, and which are not covered by the plurality of insulating films, to be electrically connected to each other by the plurality of electric conductors, and
the plurality of second translucent electrodes aligned in the second direction are connected to each other on the plurality of insulating films.

3. The electrostatic capacitance type input device according to claim 1, wherein the plurality of first translucent electrodes are formed so as to cover the entirety of portions which are included in the plurality of electric conductors, and which are not covered by the insulating film.

4. The electrostatic capacitance type input device according to claim 1, wherein the plurality of electric conductors are formed of a material having a light-blocking effect.

5. The electrostatic capacitance type input device according to claim 4, further comprising an alignment mark which is formed on the substrate by using a same material as that of the plurality of electric conductors, and is used for positioning in production.

6. The electrostatic capacitance type input device according to claim 2, wherein the plurality of first translucent electrodes are formed so as to cover the entirety of portions which are included in the plurality of electric conductors, and which are not covered by the plurality of insulating films.

7. The electrostatic capacitance type input device according to claim 2, wherein the plurality of electric conductors are formed of a material having a light-blocking effect.

8. The electrostatic capacitance type input device according to claim 7, further comprising an alignment mark which is formed on the substrate by using a same material as that of the plurality of electric conductors, and is used for positioning in production.

9. The electrostatic capacitance type input device according to claim 1, wherein
each of the plurality of first translucent electrodes is formed so as to cover the entirety of an opening of a corresponding one of the plurality of through holes and an area surrounding the entirety of a periphery of the opening, and
the plurality of first translucent electrodes extend from a surface of the insulating film along inner walls of the through holes formed in the insulating film and reach surfaces of the electric conductors, respectively, to be electrically connected to each other by the electric conductors.

10. The electrostatic capacitance type input device according to claim 9, wherein the plurality of first translucent electrodes have surface contacts with the plurality of electric conductors via the plurality of through holes formed in the insulating film, respectively, to be electrically connected to each other.

11. The electrostatic capacitance type input device according to claim 2, wherein
each of the plurality of first translucent electrodes is formed over a surface of the insulating film, a portion of the electric conductor that is not covered by the insulating film, and the surface of the substrate, and
each of the plurality of second translucent electrodes is formed over the surface of the insulating film and the surface of the substrate.

12. The electrostatic capacitance type input device according to claim 1, wherein
the material of the plurality of electric conductors is a metal, and
the electrostatic capacitance type input device further comprises a metal wiring layer formed on the substrate by using a same material as that of the plurality of electric conductors, and connected to the plurality of first translucent electrodes and the plurality of second translucent electrodes.

13. The electrostatic capacitance type input device according to claim 2, wherein
the material of the plurality of electric conductors is a metal, and
the electrostatic capacitance type input device further comprises a metal wiring layer formed on the substrate by using a same material as that of the plurality of electric conductors, and connected to the plurality of first translucent electrodes and the plurality of second translucent electrodes.

14. The electrostatic capacitance type input device according to claim 9, wherein
the material of the plurality of electric conductors is a metal, and
the electrostatic capacitance type input device further comprises a metal wiring layer formed on the substrate by using a same material as that of the plurality of electric conductors, and connected to the plurality of first translucent electrodes and the plurality of second translucent electrodes.

15. The electrostatic capacitance type input device according to claim 11, wherein
the material of the plurality of electric conductors is a metal, and
the electrostatic capacitance type input device further comprises a metal wiring layer formed on the substrate by using a same material as that of the plurality of electric conductors, and connected to the plurality of first translucent electrodes and the plurality of second translucent electrodes.

16. A method for producing an electrostatic capacitance type input device, the method comprising:
forming, on a substrate, a plurality of electric conductors aligned in a first direction and a second direction orthogonal to the first direction;
forming an insulating film such that the insulating film covers the substrate and the plurality of electric conductors with the plurality of electric conductors interposed between the substrate and the insulating film; and
forming a plurality of first translucent electrodes aligned in the first direction and the second direction, and a plurality of second translucent electrodes aligned in the first direction and the second direction such that each of the plurality of second translucent electrodes is positioned between corresponding lines of each of the plurality of first translucent electrodes and between corresponding rows of each of the plurality of first translucent electrodes, wherein
the plurality of electric conductors, formed in the forming the plurality of electric conductors, are formed on a surface of the substrate,
the insulating film formed in the forming the insulating film has, in portions where the first translucent electrodes and the electric conductors overlap each other, a plurality of through holes extending to surfaces of the electric conductors,
each of the plurality of first translucent electrodes is formed so as to cover the entirety of an opening of a corresponding one of the plurality of through holes and an area surrounding the entirety of a periphery of the opening,
the plurality of first translucent electrodes extend from a surface of the insulating film along inner walls of the through holes formed in the insulating film and reach the surfaces of the electric conductors, respectively, to be electrically connected to each other by the electric conductors, and
the plurality of second translucent electrodes aligned in the second direction are connected to each other on the insulating film.

17. The method according to claim 16, wherein
the material of the plurality of electric conductors is a material having a light-blocking effect, and
in the forming the plurality of electric conductors, simultaneously, an alignment mark used for positioning in production is formed by using a same material as that of the plurality of electric conductors.

18. The method according to claim 16, wherein
the material of the plurality of electric conductors is a metal, and
in the forming the plurality of electric conductors, simultaneously, a metal wiring layer is formed by using a same material as that of the plurality of electric conductors, so as to be connected to the plurality of first translucent electrodes and the plurality of second translucent electrodes.

19. A method for producing an electrostatic capacitance type input device, the method comprising:
forming, on a substrate, a plurality of electric conductors aligned in a first direction and a second direction orthogonal to the first direction;
forming a plurality of insulating films such that the plurality of insulating films partially cover the plurality of electric conductors, respectively, with the plurality of electric conductors interposed between the substrate and the plurality of insulating films, respectively; and
forming a plurality of first translucent electrodes aligned in the first direction and the second direction, and a plurality of second translucent electrodes aligned in the first direction and the second direction such that each of the plurality of second translucent electrodes is positioned between corresponding lines of each of the plurality of first translucent electrodes and between corresponding rows of each of the plurality of first translucent electrodes, wherein
the plurality of electric conductors, formed in the forming the plurality of electric conductors, are formed on a surface of the substrate,
the plurality of first translucent electrodes aligned in the first direction contact with portions which are included in the plurality of electric conductors, and which are not covered by the plurality of insulating films, to be electrically connected to each other by the plurality of electric conductors, and
the plurality of second translucent electrodes aligned in the second directions are connected to each other on the plurality of insulating films.

20. The method according to claim 19, wherein
the material of the plurality of electric conductors is a material having a light-blocking effect, and
in the forming the plurality of electric conductors, simultaneously, an alignment mark used for positioning in production is formed by using a same material as that of the plurality of electric conductors.

21. The method according to claim 19, wherein
the material of the plurality of electric conductors is a metal, and
in the forming the plurality of electric conductors, simultaneously, a metal wiring layer is formed by using a same material as that of the plurality of electric conductors, so as to be connected to the plurality of first translucent electrodes and the plurality of second translucent electrodes.

* * * * *